(12) United States Patent
Mack

(10) Patent No.: US 7,173,252 B2
(45) Date of Patent: Feb. 6, 2007

(54) IONIZER AND METHOD FOR GAS-CLUSTER ION-BEAM FORMATION

(75) Inventor: Michael E. Mack, Manchester, MA (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 11/257,524

(22) Filed: Oct. 25, 2005

(65) Prior Publication Data

US 2006/0097185 A1  May 11, 2006

Related U.S. Application Data

(60) Provisional application No. 60/621,913, filed on Oct. 25, 2004.

(51) Int. Cl.
  *H01J 27/02*  (2006.01)
  *H01J 27/00*  (2006.01)
  *H01J 49/00*  (2006.01)

(52) U.S. Cl. ............... 250/423 R; 250/424; 250/492.1; 250/492.2

(58) Field of Classification Search ............. 250/423 R
See application file for complete search history.

(56) References Cited

U.S. PATENT DOCUMENTS

| 5,089,710 A | 2/1992 | Kiluchi et al. |
| 5,576,538 A | 11/1996 | Sakai et al. |
| 5,814,194 A | 9/1998 | Deguchi et al. |
| 5,959,305 A | 9/1999 | Mack et al. |
| 6,416,820 B1 | 7/2002 | Yamada et al. |
| 6,486,478 B1 * | 11/2002 | Libby et al. ............. 250/492.1 |
| 6,629,508 B2 | 10/2003 | Dykstra |

(Continued)

OTHER PUBLICATIONS

Mack, M. & Ameen, M., "Wafer cooling and charging in ion implantation", appearing in Ion Implantation Science and Technology (Ed. By Ziegler, J.F.), pp. 549-552, (2000).

(Continued)

*Primary Examiner*—Nikita Wells
*Assistant Examiner*—Bernard Souw
(74) *Attorney, Agent, or Firm*—Burns & Levinson LLP; Jerry Cohen; David W. Gomes

(57) ABSTRACT

An ionizer for forming a gas-cluster ion beam is disclosed including inlet and outlet ends partially defining an ionization region traversed by a gas-cluster jet and one or more plasma electron source(s) for providing electrons to the ionizing region for ionizing at least a portion of the gas-clusters to form a gas-cluster ion beam. One or more sets of substantially linear rod electrodes may be disposed substantially parallel to and in one or more corresponding partial, substantially cylindrical pattern(s) about the gas-cluster jet axis, wherein some sets are arranged in substantially concentric patterns with differing radii. In certain embodiments, the ionizer includes one or more substantially linear thermionic filaments disposed substantially parallel to the gas-cluster jet axis, heating means, electrical biasing means to judiciously bias sets of the linear rod electrodes with respect to the thermionic filaments to achieve electron repulsion.

19 Claims, 14 Drawing Sheets

U.S. PATENT DOCUMENTS

| | | | |
|---|---|---|---|
| 6,646,277 B2 * | 11/2003 | Mack et al. | 250/492.21 |
| 6,737,643 B2 * | 5/2004 | Torti et al. | 250/288 |
| 6,831,272 B2 | 12/2004 | Mack et al. | |
| 7,060,988 B2 * | 6/2006 | Mack et al. | 250/423 R |
| 2001/0054686 A1 * | 12/2001 | Torti et al. | 250/288 |
| 2002/0130275 A1 * | 9/2002 | Mack et al. | 250/492.1 |
| 2004/0113093 A1 | 6/2004 | Mack | |
| 2005/0205801 A1 * | 9/2005 | Mack et al. | 250/423 R |
| 2006/0097185 A1 * | 5/2006 | Mack | 250/423 R |

OTHER PUBLICATIONS

Mack, M. E. et al., "Optimized charge control for high current ion implantation", 1998 Intl. Conf. on Ion Implantation Technology Proceedings, p. 486 (1999).

Erokhin, Y. et al., "Comparison of charge control technologies for advanced high current Ion implantation systems", 1998 Intl. Conf. on Ion Implantation Technology Proceedings, p. 436 (1999).

* cited by examiner

IONIZER AND METHOD FOR GAS-CLUSTER ION-BEAM FORMATION

CROSS REFERENCE TO RELATED PATENT APPLICATIONS

This Application claims priority of U.S. Provisional application Ser. No. 60/621,913 entitled "Ionizer and Method for Gas-Cluster Ion-Beam Formation", filed Oct. 25, 2004, the contents of which are incorporated herein by reference.

FIELD OF THE INVENTION

The present invention relates generally to methods and apparatus for ionizing a gas-cluster jet to form a gas-cluster ion beam (GCIB) for processing the surface of a workpiece and, more particularly, to forming a high current GCIB for workpiece processing with reduced workpiece metals contamination.

BACKGROUND OF THE INVENTION

The use of a gas-cluster ion beam (GCIB) for etching, cleaning, and smoothing surfaces is known in the art (see, for example, U.S. Pat. No. 5,814,194, Deguchi et al., incorporated herein by reference). GCIBs have also been employed for assisting the deposition of films from vaporized carbonaceous materials (see, for example, U.S. Pat. No. 6,416,820, Yamada et al., incorporated herein by reference). For purposes of this discussion, gas-clusters are nano-sized aggregates of materials that are gaseous under conditions of standard temperature and pressure. Such clusters may consist of aggregates of from a few to several thousand molecules or more that are loosely bound to form a cluster. The clusters can be ionized by electron bombardment, permitting them to be formed into directed beams of controllable energy. Such ions each typically carry positive charges of $q \cdot e$ (where e is the magnitude of the electronic charge and q is an integer of from one to several representing the charge state of the cluster ion). The larger sized cluster-ions are often the most useful because of their ability to carry substantial energy per cluster-ion, while yet having only modest energy per molecule. The clusters disintegrate on impact, with each individual molecule carrying only a small fraction of the total cluster energy. Consequently, the impact effects of large clusters are substantial, but are limited to a very shallow surface region. This makes gas-cluster ions effective for a variety of surface modification processes, without the tendency to produce deeper subsurface damage, which is characteristic of conventional ion beam processing.

Means for creation of and acceleration of such GCIBs are described in the reference (U.S. Pat. No. 5,814,194) previously cited. Presently available cluster-ion sources produce cluster-ions having a wide distribution of sizes, N, up to N of several thousand (where N=the number of molecules in each cluster). In the case of monatomic gases like argon, an atom of the monatomic gas will be referred to as either an atom or a molecule and an ionized atom of such a monatomic gas will be referred to as either an ionized atom, a molecular ion, or a monomer ion.

Many useful surface-processing effects can be achieved by bombarding surfaces with GCIBs. These processing effects include, but are not limited to, smoothing, etching, film growth, and infusion of materials into surfaces. In many cases, it is found that in order to achieve industrially practical throughputs in such processes, GCIB currents on the order of hundreds or perhaps thousands of microamps are required. Ionizers for ionizing gas-cluster jets to form GCIBs have historically been of the electron impact type, utilizing thermoelectrons to ionize gas-clusters by impact with the clusters. Such impact often ejects one or more electrons from a gas-cluster, leaving it positively charged. In U.S. Pat. No. 6,629,508 (incorporated herein by reference), Dykstra has described several forms of prior art ionizers for GCIB formation.

Several emerging applications for GCIB processing of workpieces on an industrial scale are in the semiconductor field. Due to yield considerations, such applications typically require that processing steps contribute only very low levels of contamination. Although GCIB processing of workpieces is done using a wide variety of gas-cluster source gases, many of which are inert gases, in many semiconductor processing applications it is desirable to use reactive source gases in the formation of GCIBs, sometimes in combination or mixture with inert or noble gases. Often halogen-containing gases, oxygen, and other reactive gases or mixtures thereof are incorporated into GCIBs, sometimes in combination or mixture with inert or noble gases. These reactive gases pose a problem for gas-cluster ionizer design for semiconductor processing because of their corrosive nature. For example, $NF_3$ and $O_2$ are often combined for forming GCIBs for use in etching or smoothing processes. When gas-clusters comprising $NF_3$ and $O_2$ are bombarded by electrons during ionization to form gas-cluster ions, there is a certain amount of evaporation of the gas-clusters that results, evolving corrosive gas components inside the ionizer. Since thermionic filaments used to generate thermoelectrons for ionization operate at high temperatures, they are susceptible to attack by the reactive and corrosive gases that are evolved. Particularly when the partial pressures of the reactive gases reach high levels, such attack can be exacerbated and can extend to other lower temperature materials-of-construction of the ionizer as well as to the high temperature filaments. This type of reactive interaction of corrosive gas constituents with the ionizer filament(s) and other materials in the ionizer has two important drawbacks. It shortens the operational lifetime of the filaments in the ionizers, and it results in the generation of small particles and molecules or ions of potential contaminants that can interfere with the yield of semiconductor processes. Specifically, since the thermionic filaments are normally metallic (often tungsten) and since other materials-of-construction of the conventional ionizers are also often metal (aluminum, iron, molybdenum, etc.), the use of reactive gas components in the gas-clusters results in generation of ions, molecules, and small particles of metals and compounds containing metal atoms. In a GCIB processing tool for application in the field of semiconductor processing, or in any field of application requiring low levels of contamination, such generation of contaminants is detrimental to the GCIB processing because such contaminants inevitably transport from the ionizer to the surfaces of the workpieces being processed.

In order to produce high ionization efficiency in a GCIB ionizer, it has been desirable to have available a high electron flux for impact ionization of gas-clusters. In order to produce high emission currents in thermionic emission electron sources, high electric fields are commonly employed to overcome space-charge effects that otherwise tend to limit thermionic emission. An undesirable side effect of this expedient is that the energies of the impact ionization ionizing electrons are higher than desirable, often several hundred electron volts. High energy electrons may contribute to the production of higher ionization states of multiply ionized gas-cluster ions. In some GCIB processing applications, large quantities of highly ionized (ionization state above 3 or 4) gas-cluster ions are considered detrimental to the process.

SUMMARY OF THE INVENTION

It is therefore an object of this invention to provide an ionizer and methods for generating a GCIB with high ionization efficiency for high throughput processing of workpieces.

It is a further object of this invention to provide a GCIB ionizer having an extended filament lifetime when operating with gas-clusters containing reactive gas molecules.

It is another object of this invention to provide a GCIB ionizer that generates lowered levels of contaminants even when operated in the presence of gas-clusters containing reactive gas molecules, especially for metallic contaminants.

An ionizer for ionizing a gas-cluster jet to form a gas-cluster ion-beam has a very transparent structure to facilitate high gas conductivity and to minimize internal pressure during ionization. A plasma source provides copious electrons at relatively low energies. The plasma source has a thermionic filament that is isolated from the gas-cluster ionization region to reduce interaction between the thermionic filament and corrosive gas components that may be evolved from the gas-clusters being ionized. To a substantial degree, the design permits substitution of non-metallic construction materials to produce lowered contribution to particulate and metal contamination of the workpieces processed in a GCIB processing apparatus. Most components exposed to the gas-cluster jet and its evolution products are constructed from high purity graphite, and though a hot metallic filament is used, it interacts little with any reactive gas-cluster jet evolution products. This results in extended filament operating life, and reduced contribution of contaminants from the metal filament.

BRIEF DESCRIPTION OF THE FIGURES

For a better understanding of the present invention, together with other and further objects thereof, reference is made to the accompanying drawing and detailed description, wherein.

DETAILED DESCRIPTION OF CERTAIN EMBODIMENTS OF THE INVENTION

Figure 1:
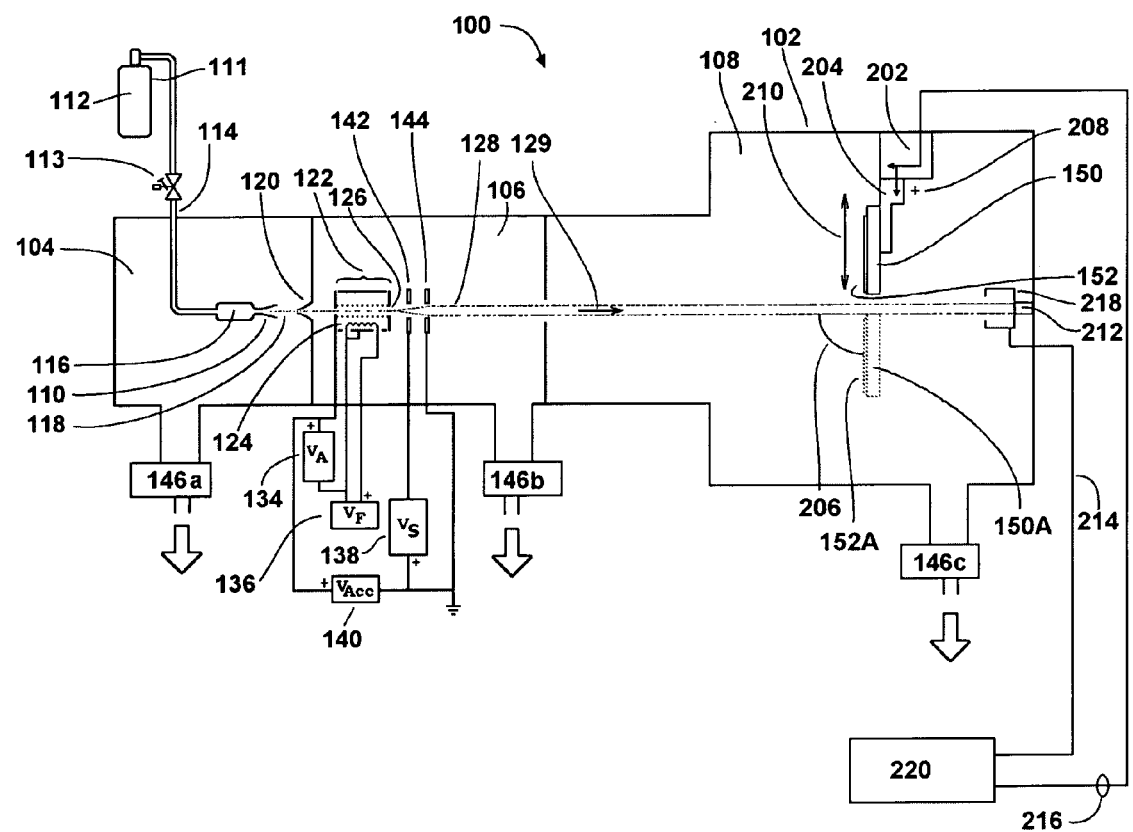
FIG. 1 is a schematic showing the basic elements of a prior art GCIB processing apparatus.

FIG. 1 shows a configuration for a GCIB processing apparatus 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $O_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, suppressor electrode 142, and processing chamber 108). Suitable condensable source gases 112 include, but are not limited to argon, nitrogen, carbon dioxide, oxygen, $NF_3$, and other gases and/or gas mixtures.

After the supersonic gas jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons, causing them to collide with the gas-clusters in the gas jet 118 where the jet passes through the ionizer 122. The electron impacts with clusters eject electrons from the clusters, causing a portion the clusters to become positively ionized. Some clusters may have more than one electron ejected and may become multiply ionized. Suppressor electrode 142, and grounded electrode 144 extract the cluster ions from the ionizer exit aperture 126, accelerate them to a desired energy (typically with acceleration potentials of from several hundred V to several tens of kV), and focuses them to form a GCIB 128. The axis 129 of the supersonic gas jet 118 containing gas-clusters is substantially the same as the axis of the GCIB 128. Filament power supply 136 provides filament voltage $V_f$ to heat the ionizer filament 124. Anode power supply 134 provides anode voltage $V_A$ to accelerate thermoelectrons emitted from filament 124 to cause the thermoelectrons to irradiate the cluster-containing gas jet 118 to produce cluster ions. Suppression power supply 138 provides suppression voltage $V_S$ to bias suppressor electrode 142. Accelerator power supply 140 provides acceleration voltage $V_{Acc}$ to bias the ionizer 122 with respect to suppressor electrode 142 and grounded electrode 144 so as to result in a total GCIB acceleration potential equal to $V_{Acc}$. Suppressor electrode 142 serves to extract ions from the ionizer exit aperture 126 of ionizer 122, to prevent undesired electrons from entering the ionizer 122 from downstream, and to form a focused GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan a large-area workpiece 152 through the stationary GCIB 128 to produce spatially homogeneous workpiece processing results.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis of the GCIB 128 so that the GCIB 128 has an angle of beam incidence 206 with respect to a workpiece 152 surface. The angle of beam incidence 206 may be 90 degrees or some other angle, but is typically 90 degrees or near 90 degrees. During Y-scanning, the workpiece 152 and the workpiece holder 150 move from the position shown to the alternate position "A" indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer based controller, connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 2:
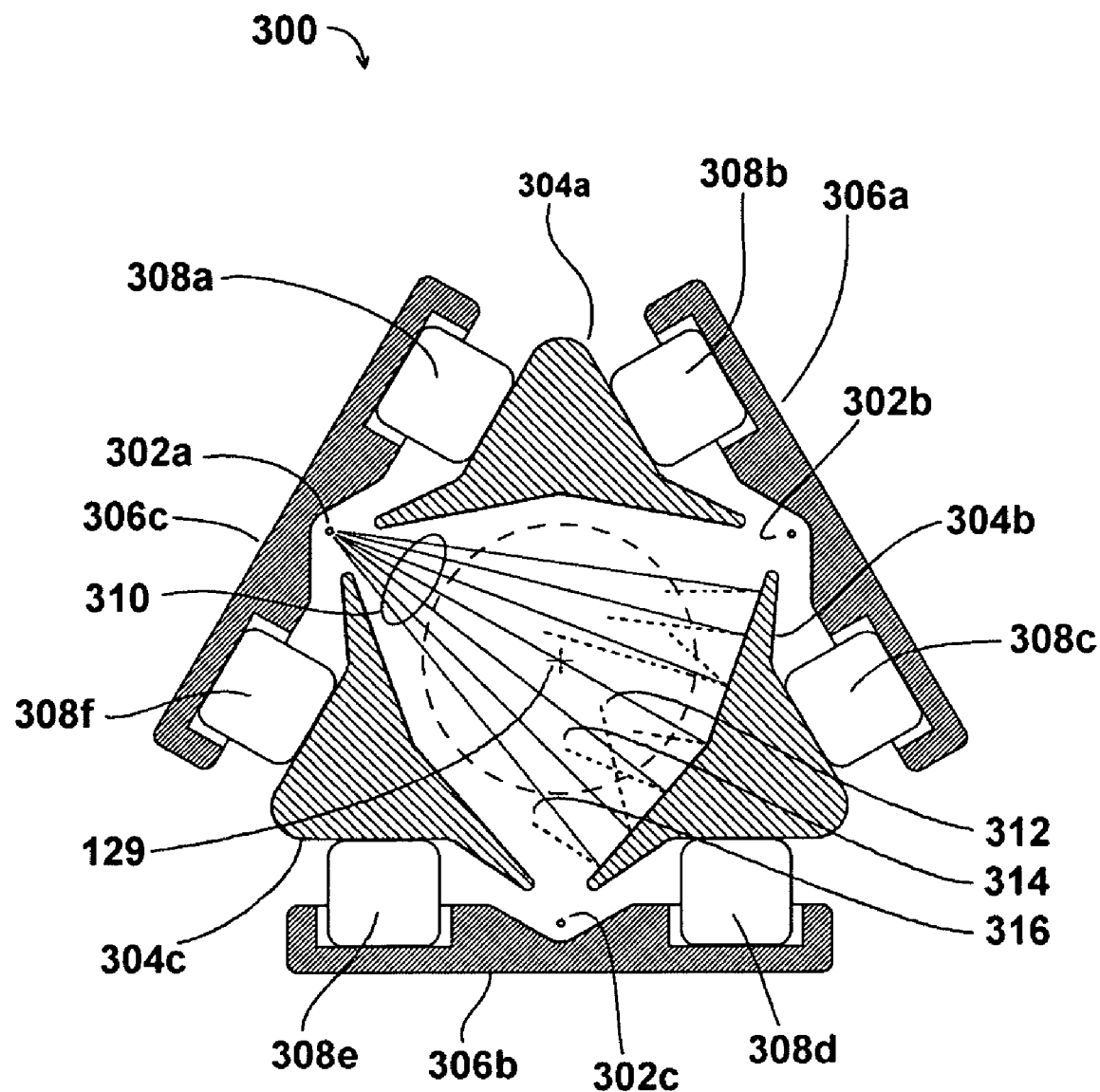
FIG. 2 is a schematic illustrating a portion of a prior art gas-cluster ionizer for ionizing a gas-cluster jet.

FIG. 2 shows a section 300 of a prior art gas-cluster ionizer for ionizing a gas-cluster jet. The section is transverse to the cluster-ion jet axis 129. Clusters leaving the skimmer (120, FIG. 1) and entering an ionizer will travel with roughly the sound velocity characteristic of the gas. For typical gas-cluster sizes (2000 to 15000 atoms), this corresponds to a kinetic energy of 130 to 1000 eV. At these low energies, any departure from space charge neutrality within the ionizer will result in a rapid blow up of the jet with a significant loss of beam current. FIG. 2 illustrates a prior art self-neutralizing ionizer. As with other prior art ionizers, gas-clusters are ionized by electron impact. In this design, thermoelectrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermolectrons 310 pass through the gas cluster jet and the gas-cluster jet axis 129 and then strike the opposite beam-forming electrode 304b to produce low energy secondary electrons (312, 314, and 316 indicated for examples). Though (for simplicity) not shown, linear thermionic filaments 302b and 302c also produce thermoelectrons that subsequently produce low energy secondary electrons. All the secondary electrons help ensure that the ionized-cluster jet remains space charge neutral by providing low energy electrons that can be attracted into the positively ionized gas-cluster jet as required to maintain space-charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c Insulators 308a, 308b, 308c, 308d, 308e, and 308f electrically insulate and support electrodes. This self-neutralizing ionizer is very effective and achieves over 1000 µA argon GCIBs. A major limitation of the self-neutralizing ionizer of FIG. 2 is that gases evolved from gas-clusters during the ionization processes produce an elevated internal pressure. With corrosive gases, particularly $NF_3$ in $O_2$, this results in attack of the various ionizer parts, particularly the linear thermionic filaments 302a, 302b, and 302c. Accordingly, filament life is shortened and unacceptable metals contamination is produced on workpieces being processed by GCIB.

Figure 3:
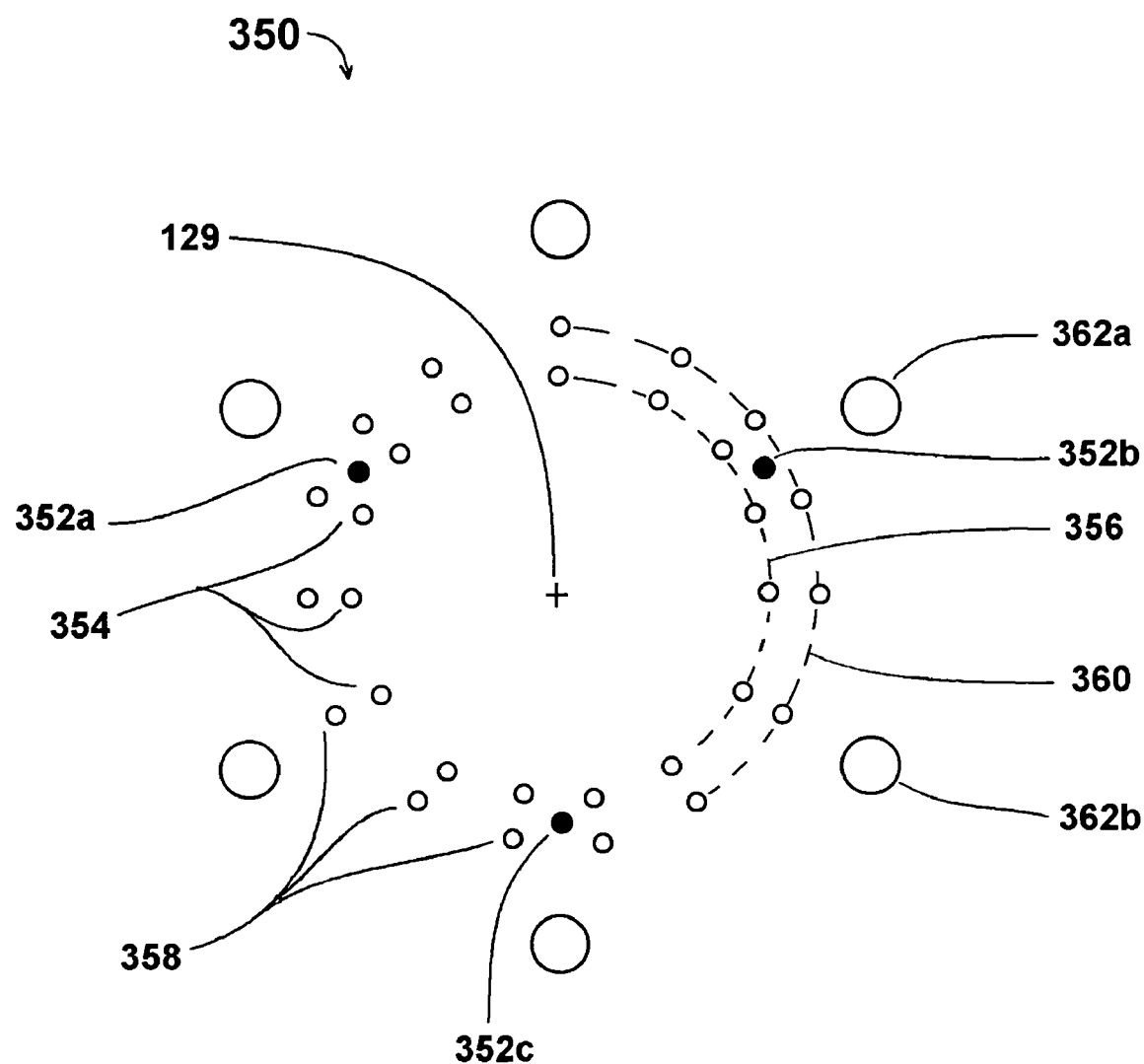
FIG. 3 is an illustration of a section of an improved gas-cluster ionizer for ionizing a gas-cluster jet according to the present invention.

FIG. 3 shows a schematic section 350 of an improved gas-cluster ionizer for ionizing a gas-cluster jet. The section is transverse to the cluster-ion jet axis 129. In this design, the large electrodes of the self-neutralizing ionizer shown in FIG. 2 have been replaced with thin rod electrodes arranged in substantially cylindrical patterns concentric with cluster-ion jet axis 129. There are multiple linear thermionic filaments 352a, 352b, and 352c (typically tungsten) disposed symmetrically about, equidistant from, and parallel to cluster-ion jet axis 129. Multiple thin rod anode electrodes (three examples indicated by 354) are arranged on a circle 356 that is substantially concentric with cluster-ion jet axis 129. The anode electrodes (three examples indicated by 354) are all biased at the same electrical potential, which is positive with respect to the potentials on the linear thermionic filaments 352a, 352b, and 352c. Multiple thin rod electron-repeller electrodes (three examples indicated by 358) are arranged on a circle 360 that is substantially concentric with cluster-ion jet axis 129 and has a larger radius than the radius of the circle 356. The electron-repeller electrodes (three examples indicated by 358) are all biased at the same electrical potential, which is negative with respect to the potentials on the linear thermionic filaments 352a, 352b, and 352c. The multiple linear thermionic filaments 352a, 352b, and 352c disposed symmetrically about, and equidistant from the cluster-ion jet axis 129 at a distance intermediate to the radius of circle 356 and the radius of circle 360. All electrodes are supported at their ends by support plates not shown and the entire structure of the ionizer uses support rods (two examples indicated by 362a and 362b) for mechanical support.

Figure 4:
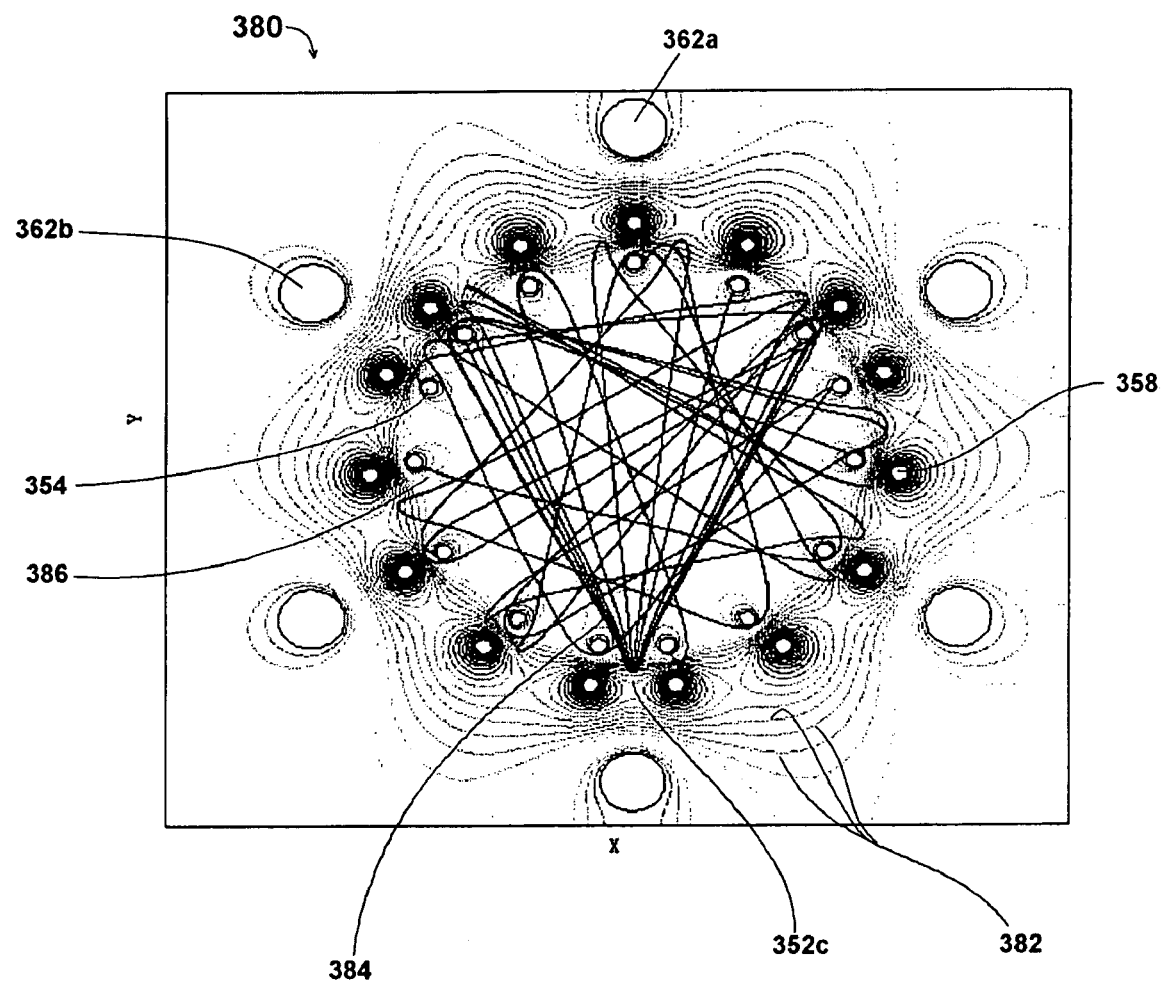
FIG. 4 is an illustration of exemplary electron paths within an improved gas-cluster ionizer such as shown in FIG. 3.

FIG. 4 illustrates a numerical simulation of the improved gas-cluster ionizer shown in FIG. 3. In the simulation, the anode electrodes 354 (for example) are biased at $V_{Acc}$ (the ionizer potential). The multiple linear thermionic filaments 352c, in this example, are biased at $V_{Acc}-165V$. The electron-repeller electrodes 358, in this example, are biased at $V_{Acc}+325$ V. In the simulation, electric field equipotential lines 382 (examples indicated) are shown and thermoelectrons 384 (examples indicated) are shown to be extracted from linear thermionic filament 352c (for example) and then to orbit within the ionizer until they eventually strike one of the anode electrodes 354 (for example). An example of one electron striking an anode electrode is shown at 386. Since the thermoelectrons orbit, they have a high efficiency for ionizing gas-clusters in the gas-cluster jet. Also, since they must eventually strike an anode electrode 354 (for example), they cause secondary emission (not shown for simplicity) of low energy secondary electrons in large quantities. As in the self-neutralizing ionizer previously described, all the secondary electrons help ensure that the ionized-cluster jet remains space-charge neutral by providing low energy electrons that can be attracted into the positively ionized gas-cluster jet as required to maintain neutrality. The thin rod electrode structure of the ionizer assures high conductance for gases out of the ionizer compared to the self-neutralizing ionizer previously described (FIG. 2), assuring that lower operating pressures are attained within the ionizer. Because of the lower pressure, the generation of contaminant ions, molecules, and particles is substantially reduced over the performance of the prior art ionizer of FIG. 2. However, because the hot thermionic filaments 352a, 352b, and 352c are directly exposed to reactive components evolved from gas-clusters, contamination can still be high, particularly with the more corrosive gases like $NF_3-O_2$ mixtures.

Figure 5:
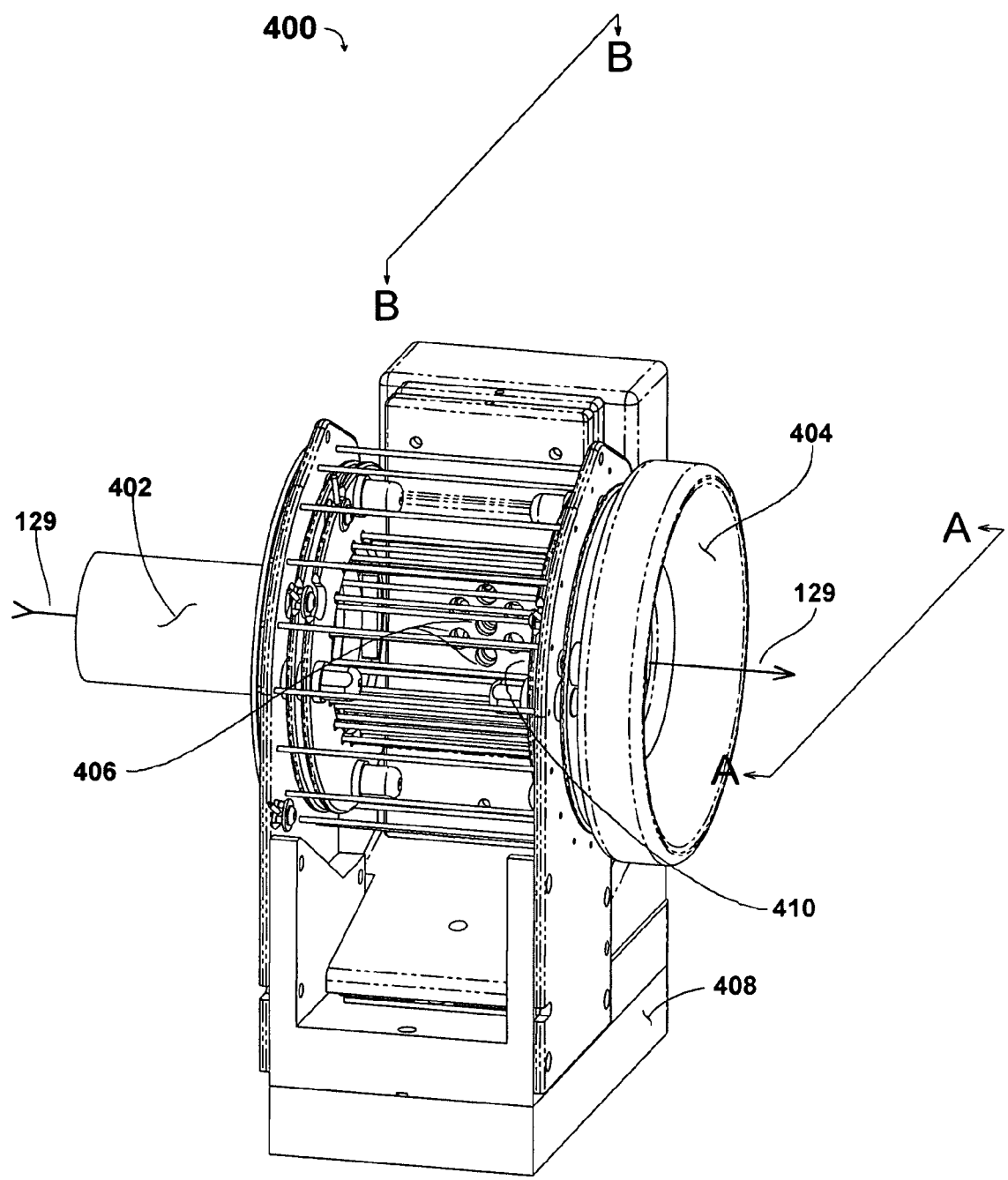
FIG. 5 is an illustration of a side of a further improved ionizer 400 according to an embodiment of the present invention.

FIG. 5 is a perspective view of an improved ionizer 400 according to the invention. In order to isolate the hot thermionic metallic filaments from corrosive gas products evolved from gas-clusters, a noble gas plasma electron source replaces the thermionic filaments of prior designs as the immediate source of electrons. This ionizer has an open, thin rod electrodes, structure similar to that shown and discussed for FIGS. 3 and 4 previously, for low-pressure operation. Because the impact ionizing electron source is a noble gas plasma rather than a hot metal filament and because all materials of construction that are significantly exposed to corrosive or reactive gases evolved from the gas-cluster jet are high purity graphite, the generation of metallic contaminants by the ionizer is extremely low. A metal (typically tungsten) pigtail filament is employed in a plasma source to generate the plasma electron source, but due to its isolation, it does not significantly interact with corrosive and reactive components of the gas-cluster jet evolution products. The improved ionizer 400 surrounds a gas-cluster jet axis 129. The ionizer's upstream or inlet end comprises an extension tube 402. The ionizer's downstream or outlet end comprises an exit electrode 404. Multiple apertures 406 (three indicated for examples) admit electrons to the ionizing region of the ionizer from the noble gas plasma electron source for impact ionization of gas-clusters traveling along a jet along gas-cluster jet axis 129. Cutting planes, designated A—A and B—B, are indicated for orientation in subsequent figures. An electrically insulating support 408 provides mounting means for disposing the ionizer with respect to the gas-cluster jet axis 129, while permitting electrical bias of the entire ionizer body to a high voltage $V_{Acc}$ consistent with the general goal of producing an energetic accelerated GCIB for workpiece processing. The extension tube 402 has a length $L_E$ and serves to prevent positive ions formed in the ionizer from being extracted backward through the ionizer's inlet end by the high potential difference between ionizer 400 and the skimmer aperture (120, FIG. 13). The extension tube 403 is at ionizer potential ($V_{Acc}$) and shields ions within the ionizer 400 from effects of external electrical fields in the upstream direction. Support plate 410 is referenced in the discussion of FIG. 7 below.

Figure 6:
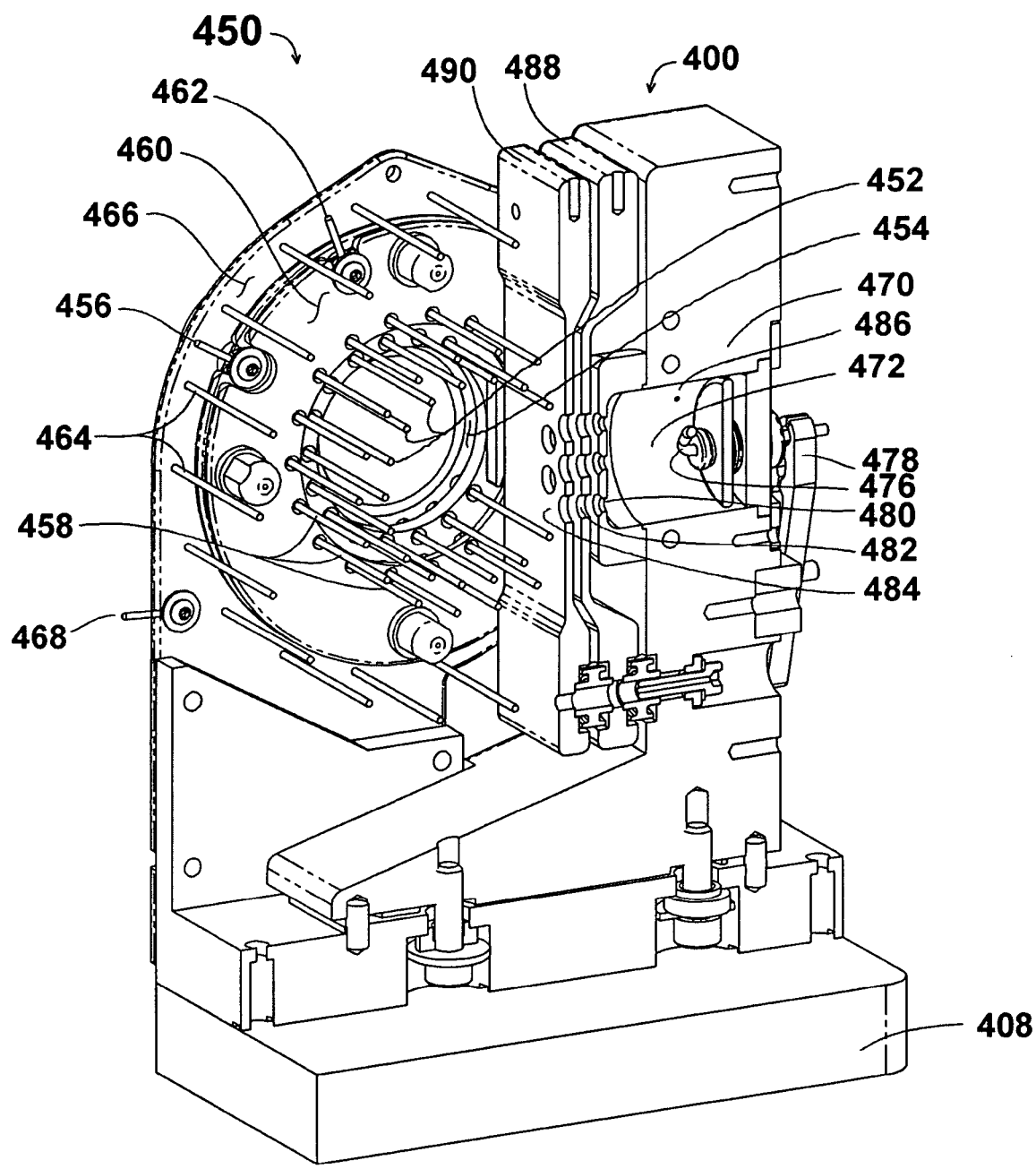
FIG. 6 is a cut-away illustration of an improved ionizer 400 such as shown in FIG. 5.

FIG. 6 presents a cut-away section 450 of the improved ionizer 400 shown in FIG. 5. The cut is made along cutting plane B—B, as shown in FIG. 5. A partial cylindrical array of thin rod anode electrodes 452 (three of fifteen indicated, for example) is supported and electrically connected by support plate 454. An electrical connection terminal 456 permits electrical connection for biasing support plate 454 and thin rod anode electrodes 452. The partial cylindrical array of thin rod anode electrodes 452 is substantially concentric with gas-cluster jet axis (129 in FIG. 5). A partial cylindrical array of thin rod electron-repeller electrodes 458 (three of thirteen indicated, for example) are supported and electrically connected by support plate 460. The partial cylindrical array of thin rod electron-repeller electrodes 458 is substantially concentric with gas-cluster jet axis (129 in FIG. 5). An electrical connection terminal 462 permits electrical connection for biasing support plate 460 and thin rod anode electrodes 458. A partial cylindrical array of thin rod ion-repeller electrodes 464 (two of eleven indicated, for example) are supported and electrically connected by support plate 466. The partial cylindrical array of thin rod ion-repeller electrodes 464 is substantially concentric with gas-cluster jet axis (129 in FIG. 5). An electrical connection terminal 468 permits electrical connection for biasing support plate 466 and thin rod anode electrodes 464. A noble gas plasma electron source comprises plasma chamber body 470, plasma chamber 472, thermionic filament 476, noble gas entry aperture 486, and multiple plasma source chamber extraction apertures 480 (one of seven indicated, for example). Two filament attachment clamps 478 (one of two shown in this cutaway view) provide electrical connection to thermionic filament 476, which is preferably a tungsten pigtail filament having 1½ turns in the pigtail (additional detail viewable in FIG. 7.) An electron-acceleration electrode 488 has multiple apertures 482 (one of seven indicated, for example). An electron-deceleration electrode 490 has multiple apertures 484 (one of seven indicated, for example). Multiple apertures 484, multiple apertures 482 and multiple apertures 480 are all aligned, from multiple plasma source chamber extraction apertures 480 through multiple apertures 482 through multiple apertures 484.

Figure 7:
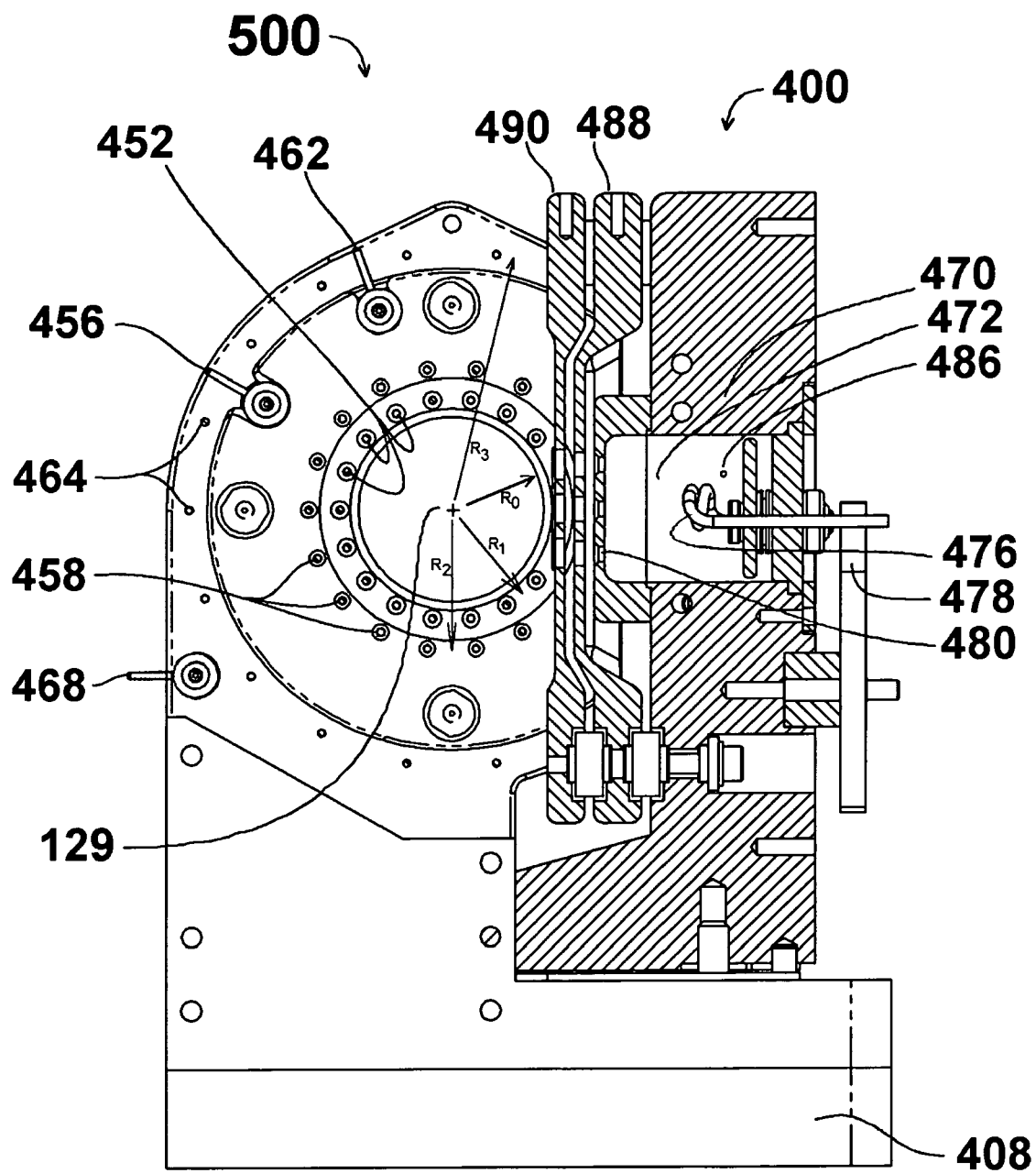
FIG. 7 is a sectional view of the improved ionizer 400 shown in FIG. 5.

FIG. 7 presents a sectional view of a portion 500 of the improved ionizer 400 shown in FIG. 5. The cut is made along cutting plane B—B, as shown in FIG. 5. This view shows that the ionizer 400 has a clear aperture with a radius $R_0$. In a preferred embodiment, $R_0$ is approximately 17 mm. The radius of the partial cylindrical array of thin rod anode electrodes 452 (three of fifteen indicated, for example) is $R_1$. In a preferred embodiment, $R_1$ is approximately 22 mm. The radius of the partial cylindrical array of thin rod electron-repeller electrodes 458 (three of thirteen indicated, for example) is $R_2$. In a preferred embodiment, $R_2$ is approximately 33 mm. The radius of the partial cylindrical array of thin rod ion-repeller electrodes 464 (two of eleven indicated, for example) is $R_3$. In a preferred embodiment, $R_3$ is approximately 46 mm. The active ionization region of the improved ionizer 400 is the substantially cylindrical volume defined by the radius $R_0$ and the length L of the distance between support plate 460 and the opposing support plate (410, FIG. 5) that supports the opposite end of the partial cylindrical array of thin rod electron-repeller electrodes 458. In a preferred embodiment, L is approximately 2.8 $R_0$. Values of L greater than 1.8 $R_0$ can be perform effectively. The length of the extension tube is $L_E$. In a preferred embodiment $L_E$ is approximately 4 $R_0$. Values of $L_E$ greater than about 2 $R_0$ provide significant benefit, with longer values of $L_E$ generally providing greater effectiveness at reducing backward extraction of ions.

Figure 8:
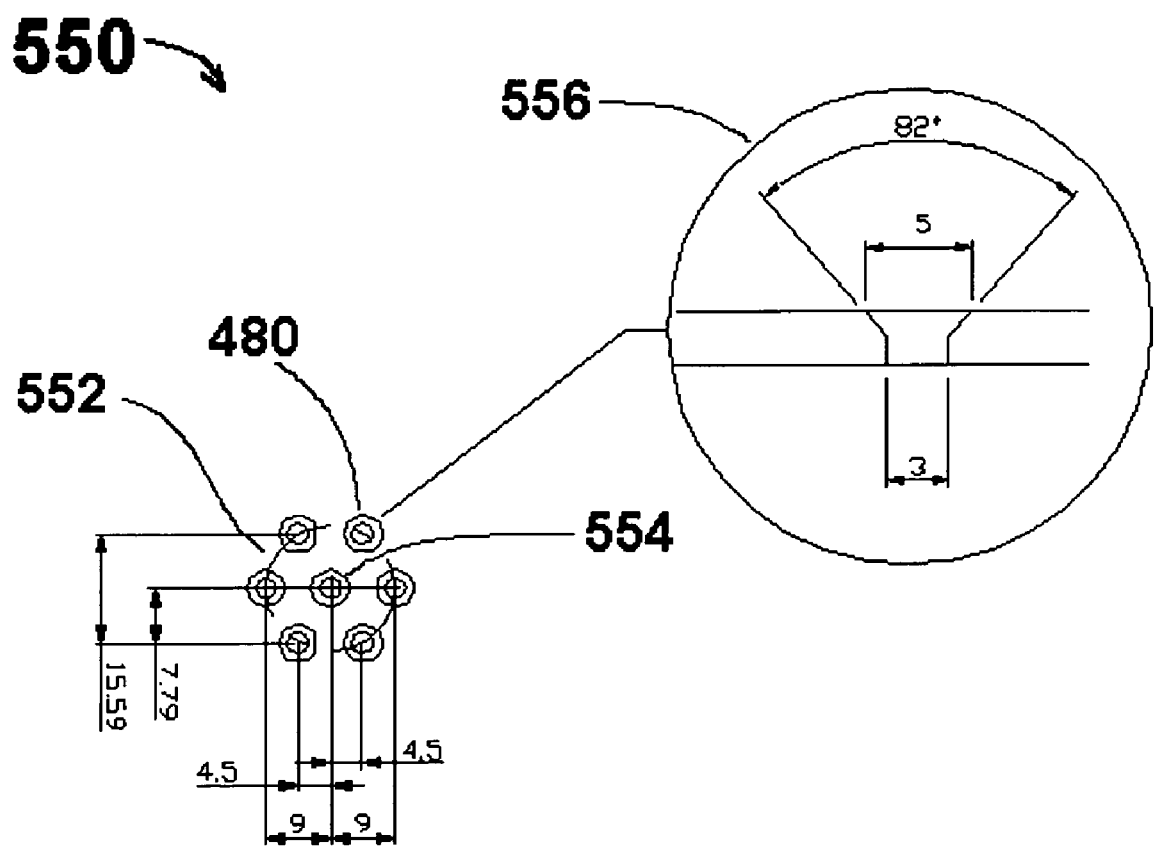
FIG. 8 is a detailed drawing showing configuration of a preferred embodiment of extraction apertures in a noble gas plasma electron source in accordance with the present invention.

FIG. 8 provides a detailed representation of a configuration 550 of extraction apertures in the noble gas plasma electron source. Seven extraction apertures are arranged with six apertures 480 (one shown for example) approximately equally spaced on the circumference of a circle 552 of approximately 18 mm diameter and a seventh center aperture 554. Inset 556 shows additional details of the apertures 480. Inner diameter is approximately 3 mm and exit diameter is approximately 5 mm. Corresponding apertures in electron acceleration electrode 488 are approximately 5.5 mm and corresponding apertures in electron deceleration electrode 490 are approximately 6 mm.

Figure 9:
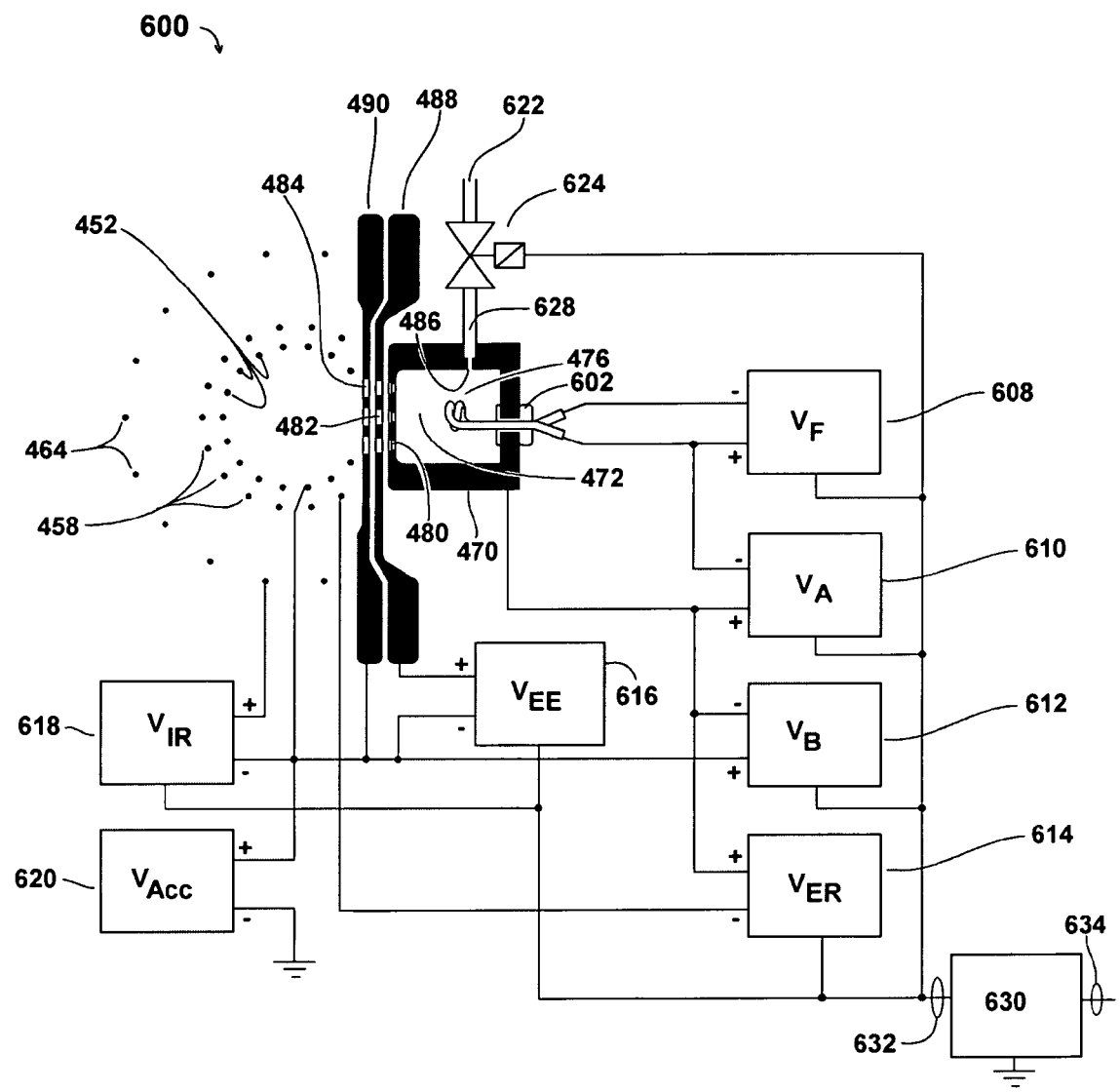
FIG. 9 is a schematic showing details of biasing of the electrodes of improved ionizer 400.

FIG. 9 is a schematic of a portion 600 of the system illustrating details of biasing of the electrodes of improved ionizer 400. As shown, thermionic filament 476 is insulated from the plasma chamber body 470 by insulator 602. Noble gas is admitted to the plasma chamber 472 via noble gas entry aperture 486. An insulated gas feed tube 622 provides pressurized noble gas (preferably argon) to a remotely controllable gas valve 624 (preferably a mass flow controller valve with fiber optic control input) that regulates the admission of low pressure gas to the plasma chamber 472 via gas feed tube 628 and noble gas entry aperture 486. The remotely controllable gas valve 624 is at the ionizer potential (approximately $V_{Acc}$) to avoid high voltage breakdown through low-pressure gas in gas feed tube 628. Insulated gas feed tube 622 contains only gas at a pressure greater than one atmosphere to prevent high voltage discharge along the gas column to ground. A filament power supply 608 provides filament voltage $V_F$ for driving current through thermionic filament 476 to stimulate thermoelectron emission. Filament power supply 608 controllably provides about 140 to 200 amps at 3 to 5 volts. An arc power supply 610 controllably provides arc voltage to bias the plasma chamber body 470 positive with respect to the thermionic filament 476. Arc power supply 610 is typically operated at a fixed voltage $V_A$, typically about 35 volts, and provides a means for accelerating the electrons within the plasma chamber for forming a plasma. Filament current is controlled to regulate the arc current supplied by the arc power supply 610. Arc power supply 610 is capable of providing up to 5 A arc current to the plasma arc. The arc in the plasma chamber 472 results in creation of argon plasma in the chamber. Electrons in the argon plasma are extracted from the plasma chamber 472 and directed into the ionizer by an acceleration-deceleration extraction system. Electron deceleration electrode 490 is biased positively with respect to the plasma chamber body 470 by electron bias power supply 612. Electron bias power supply 612 provides bias voltage $V_B$. $V_B$ is controllably adjustable over the range of from 30 to 400 V. Electron acceleration electrode 488 is biased positively with respect to electron deceleration electrode 490 by electron extraction power supply 616. Electron extraction power supply 616 provides electron extraction voltage $V_{EE}$. $V_{EE}$ is controllable in the range from 20 to 250 V. An acceleration power supply 620 supplies acceleration voltage $V_{Acc}$ to bias thin rod anode electrodes 452 and electron deceleration electrode 490 and extension tube (402, FIG. 5) and exit electrode (404, FIG. 5) positive with respect to earth ground. $V_{Acc}$ is the acceleration potential for gas-cluster ions produced in ionizer 400 and is controllable and adjustable in the range from 1 to 80 kV. An electron repeller power supply 614 provides electron repeller bias voltage $V_{ER}$ for biasing electron repeller electrodes 458 negative with respect to $V_{Acc}$. $V_{ER}$ is controllable in the range of from 50 to 100 V. An ion repeller power supply 618 provides ion repeller bias voltage $V_{IR}$ to bias ion repeller electrodes 464 positive with respect to $V_{Acc}$. $V_{IR}$ is controllable in the range of from 50 to 150 V. A fiber optics controller 630 receives electrical control signals on cable 634 and converts them to optical signals that are transmitted on fiber optics control link 632 to control components operating at high potentials using signals from a grounded control system. Fiber optics control link 632 conveys control signals to remotely controllable gas valve 624, to filament power supply 608, to arc power supply 610, to electron bias power supply 612, to electron repeller power supply 614, to electron extraction power supply 616, and to ion repeller power supply 618.

Figure 10:
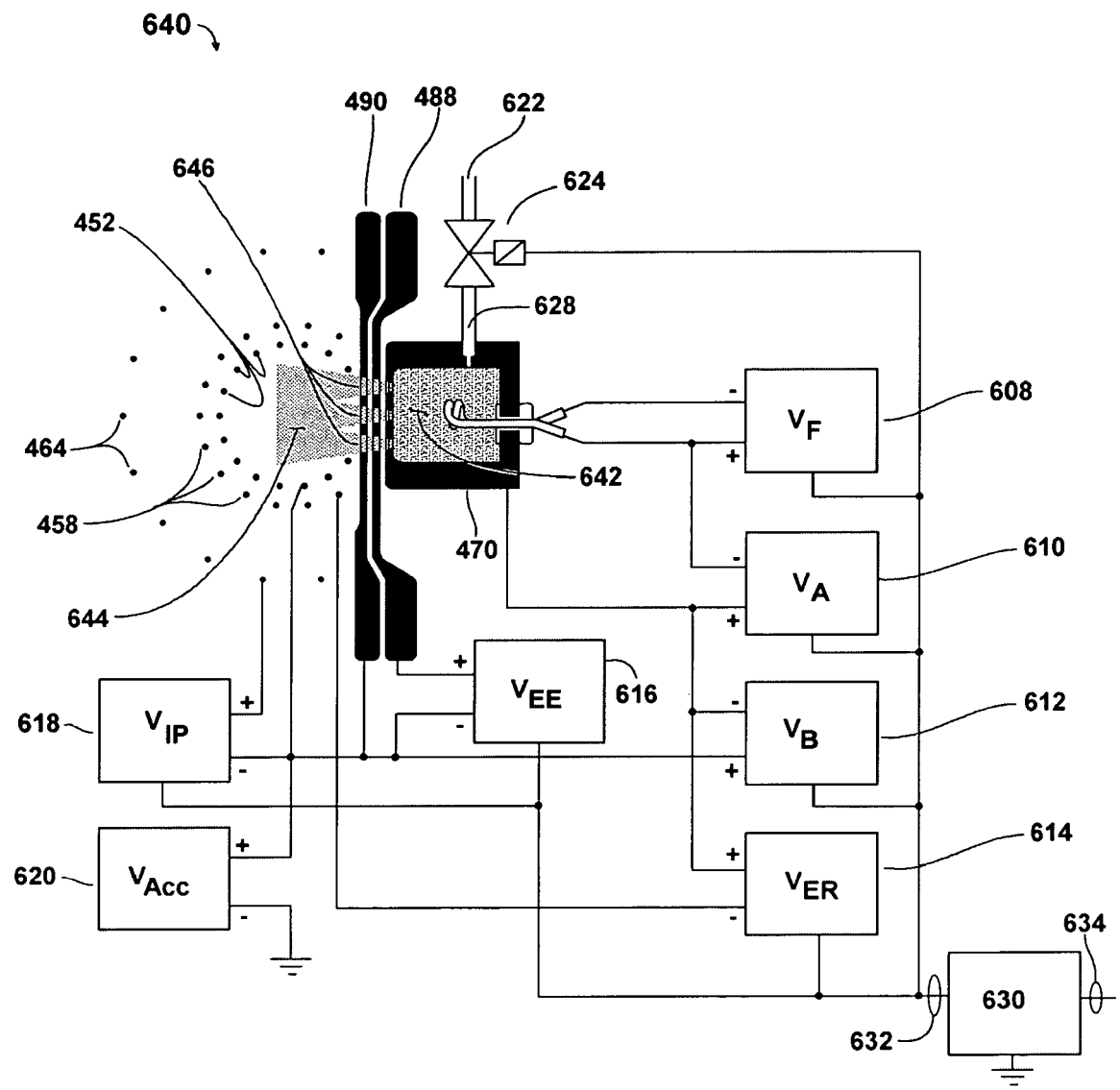
FIG. 10 is a schematic showing plasma formation and electron extraction from the noble gas plasma electron source.

FIG. 10 is a schematic of a portion 640 of the system showing plasma formation and electron extraction from the noble gas plasma electron source. Argon plasma 642 is generated in the plasma chamber (472, FIG. 9). Electrons 644 are extracted from the argon plasma 642 and injected into the active ionization region of improved ionizer 400. As was previously discussed in relation to FIG. 4, electrostatically confined extracted electrons 644 orbit, eventually ionizing gas-clusters or striking thin rod anode electrodes 452 or electron deceleration electrode 490, where they produce large quantities of low energy secondary electrons. The secondary electrons help ensure that the newly-formed ionized cluster jet remains space-charge neutral by providing low energy electrons that can be attracted into the positively ionized gas-cluster jet as required to maintain neutrality. Since controllable gas valve 624 continuously admits low-pressure argon gas into the plasma chamber (472, FIG. 6) via gas feed tube 628, there is a continuous flow of noble gas (preferably argon) out of the plasma chamber (472, FIG. 6) through multiple apertures 646 and the pressure in the plasma chamber (472, FIG. 6) is higher than that in the active region outside the plasma chamber (472, FIG. 6). This flow tends to reduce entry of reactive or corrosive gases evolved from the gas-cluster jet from entering the plasma chamber to react with the hot thermionic filament (476, FIG. 9). Of course there is some back diffusion of reactive gas into the plasma chamber (472, FIG. 6) through multiple apertures 646, but the amount is so small that it has little practical effect. A small amount of tungsten can be expected to evaporate from thermionic filament (476, FIG. 9) and escape through multiple apertures 646 to contribute metallic contaminants to the process, but again, the amount is much smaller than in prior art ionizers for GCIB. Since the interaction of reactive gases with the hot thermionic filament is limited and since all of the electrodes and their support plates can be fabricated from high purity graphite, the improved ionizer 400 offers little opportunity for generation of metallic contaminants as a result of interaction of reactive gases with the ionizer.

Figure 11:
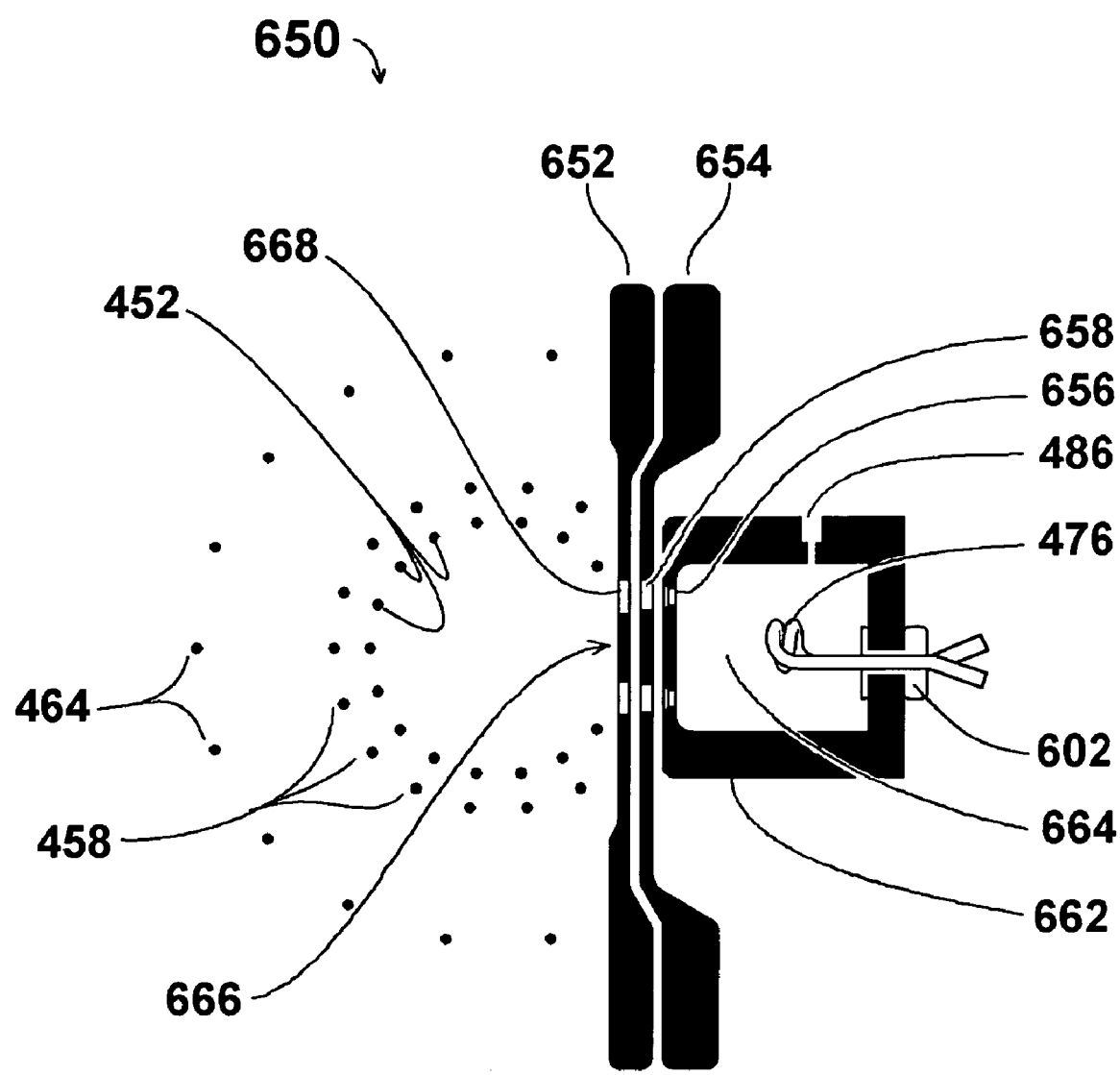
FIG. 11 is a schematic of a second preferred embodiment of the configuration of the extraction apertures.

FIG. 11 is a schematic of a portion 650 of a second preferred embodiment of the configuration of the extraction apertures 656 (one of six indicated), 658 (one of six indicated), and 668 (one of six indicated) in the plasma chamber body 662, in the electron acceleration electrode 654, and in the electron deceleration electrode 652, respectively. In this configuration, the center extraction aperture (554, FIG. 8) employed in the configuration of FIG. 8 has been omitted, leaving an extraction aperture pattern of only six extraction apertures. Note that at position 666 of deceleration electrode 652 there is no center aperture (as contrasted to FIG. 10). By omitting the center aperture, the solid angle for line-of-sight escape of evaporated tungsten from filament 476 is significantly reduced without a corresponding large reduction in the amount of electrons that can be extracted from the plasma electron source plasma chamber 664. Accordingly, further reduction in metallic contamination from the ionizer is realized with only a small reduction in performance.

Figure 12:
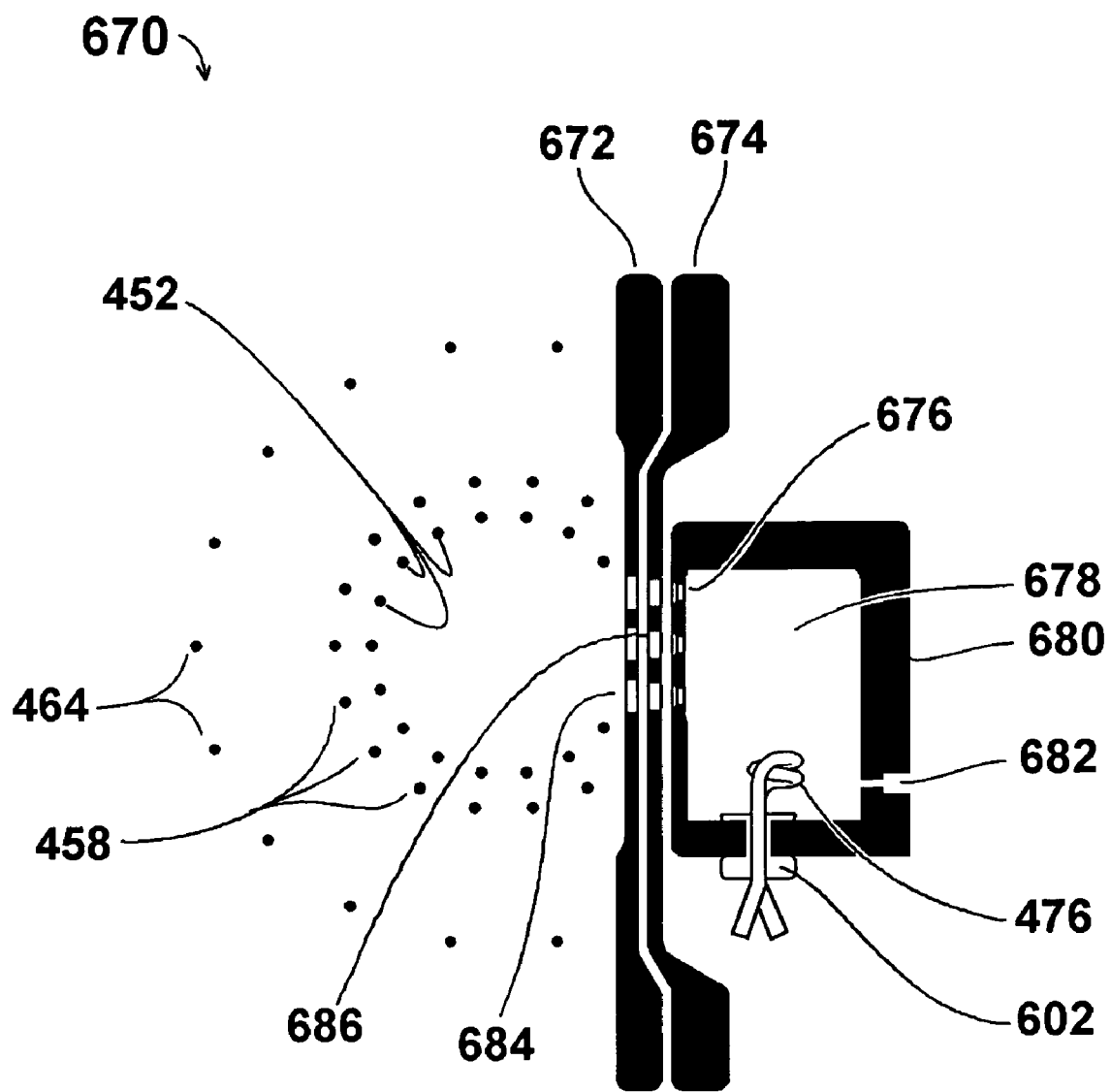
FIG. 12 is a schematic of a third preferred embodiment of the configuration of the plasma chamber 678 and the extraction apertures 676.

FIG. 12 is a schematic of a portion 670 of a third preferred embodiment of the configuration of the plasma chamber 678 and the extraction apertures 676 (one of seven indicated), 686 (one of seven indicated), and 684 (one of seven indicated) in the plasma chamber body 680, in the electron acceleration electrode 674, and in the electron deceleration electrode 672, respectively. A noble gas entry aperture 682 facilitates introducing noble gas into the plasma chamber 678 for plasma formation. In this configuration, the extraction aperture configuration is the same as previously shown in FIG. 8 including the center extraction aperture (554, FIG. 8). By rotating the plasma chamber body 680 relative to the position of plasma chamber body (470, FIG. 10), the location of the filament 476 is offset from the extraction apertures so that there is no direct line-of-site for escape of evaporated tungsten from filament 476. Accordingly, further reduction in metallic contamination from the ionizer is realized with no reduction in performance.

Figure 13:
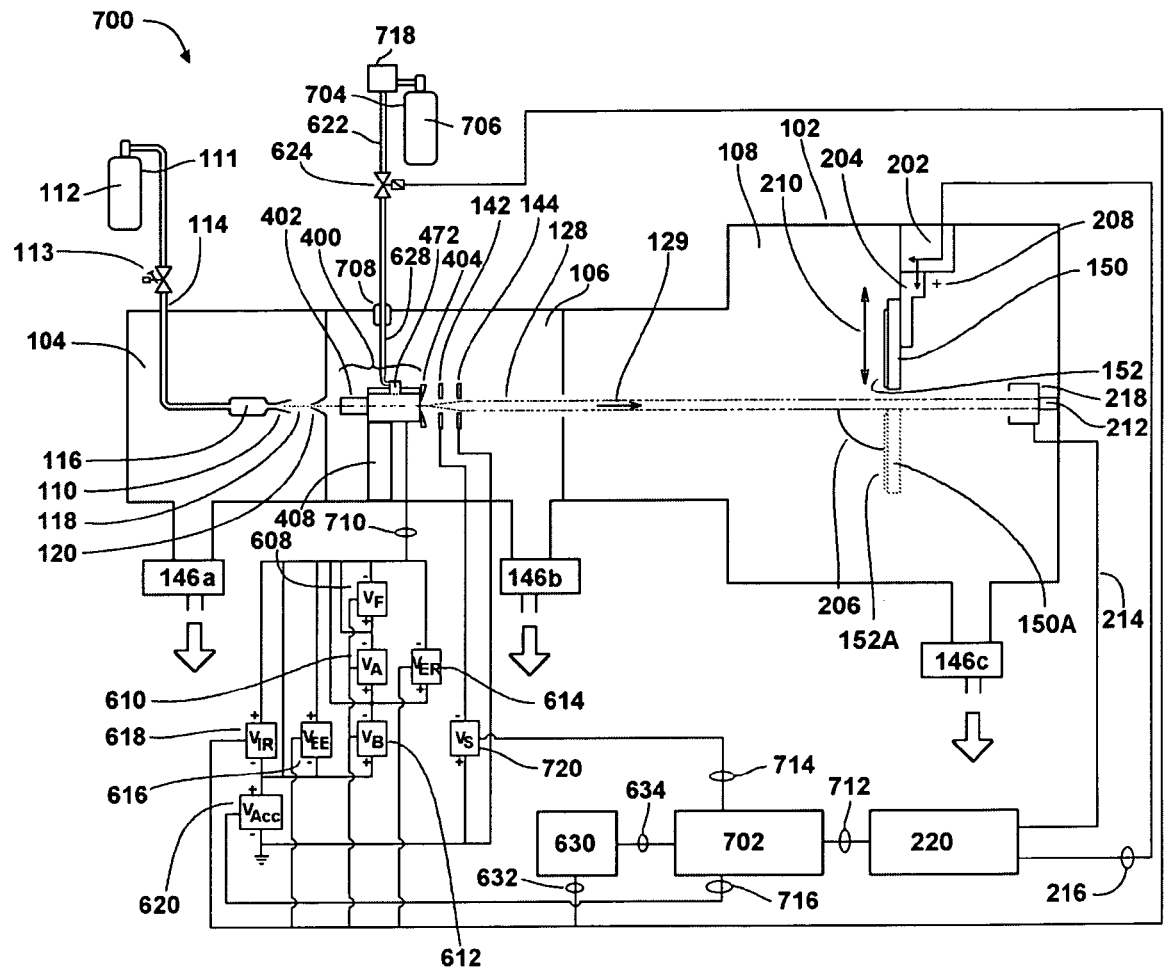
FIG. 13 is a schematic showing elements of a typical configuration for a GCIB processing apparatus 700 incorporating an improved ionizer 400 in accordance with the invention.

FIG. 13 shows a schematic of the basic elements of a typical configuration for a GCIB processing apparatus 700 incorporating the improved ionizer 400 of the invention. The improved ionizer 400 is disposed so as to lie along and to surround the gas-cluster jet axis 129 by electrically insulating support 408 so that after passing through the skimmer aperture 120, the supersonic gas jet 118 enters the extension tube 402 of the improved ionizer 400. Within improved ionizer 400, gas clusters in the supersonic gas jet are ionized by electron impact ionization and the resulting GCIB 128 is maintained substantially space-charge neutral. Accelerator power supply 620 provides acceleration voltage $V_{Acc}$ to provide GCIB acceleration and is controllably adjustable over the range of from 1 to 80 kV. Suppressor power supply 720 provides suppressor voltage $V_S$ to suppressor electrode 142 to extract gas-cluster ions from the improved ionizer 400, to focus the GCIB 128, and to prevent downstream electrons from back-streaming and loading the accelerator power supply 620. $V_S$ is controllably adjustable over the range of from 0 to 50 kV. Gas-cluster ions are extracted from ionizer 400 by the strong electric field created between exit electrode 404 and suppressor electrode 142. Filament power supply 608, arc power supply 610, electron bias power supply 612, electron repeller power supply 614, electron extraction power supply 616, and ion repeller power supply 618, provide bias voltages and power currents to improved ionizer 400 through electrical cable 710, according to principals previously described in the discussion of FIG. 9. A system controller 702 provides control signals to coordinate and control controller 220 via cable 712, suppressor power supply 720 via cable 714, accelerator power supply 620 via cable 716 and fiber optics controller 630 via cable 634. Fiber optics controller 630 converts electrical control signals received on cable 634 to optical signals that are transmitted on fiber optics control link 632 to control remotely controllable gas valve 624, to filament power supply 608, to arc power supply 610, to electron bias power supply 612, to electron repeller power supply 614, to electron extraction power supply 616, and to ion repeller power supply 618. A gas bottle 704 contains a pressurized noble gas 706, preferably argon. A pressure regulator 718 regulates the pressure of the noble gas to a value approximately in the range of from one to two atmospheres. An insulated gas feed tube 622 conducts pressure regulated gas from the pressure regulator 718 at ground potential to the remotely controllable gas valve 624 at ionizer potential (approximately $V_{Acc}$). The remotely controllable gas valve 624 controls the low-pressure flow of gas into the plasma chamber 472 of the improved ionizer 400. Low-pressure noble gas flows from remotely controllable gas valve 624 through gas line 628 via insulated feed-through 708 into the plasma chamber 472. The GCIB 128 controllably processes workpiece 152 without contributing an undesirably high level of metallic and particulate contamination to the workpiece 152.

Figure 14:
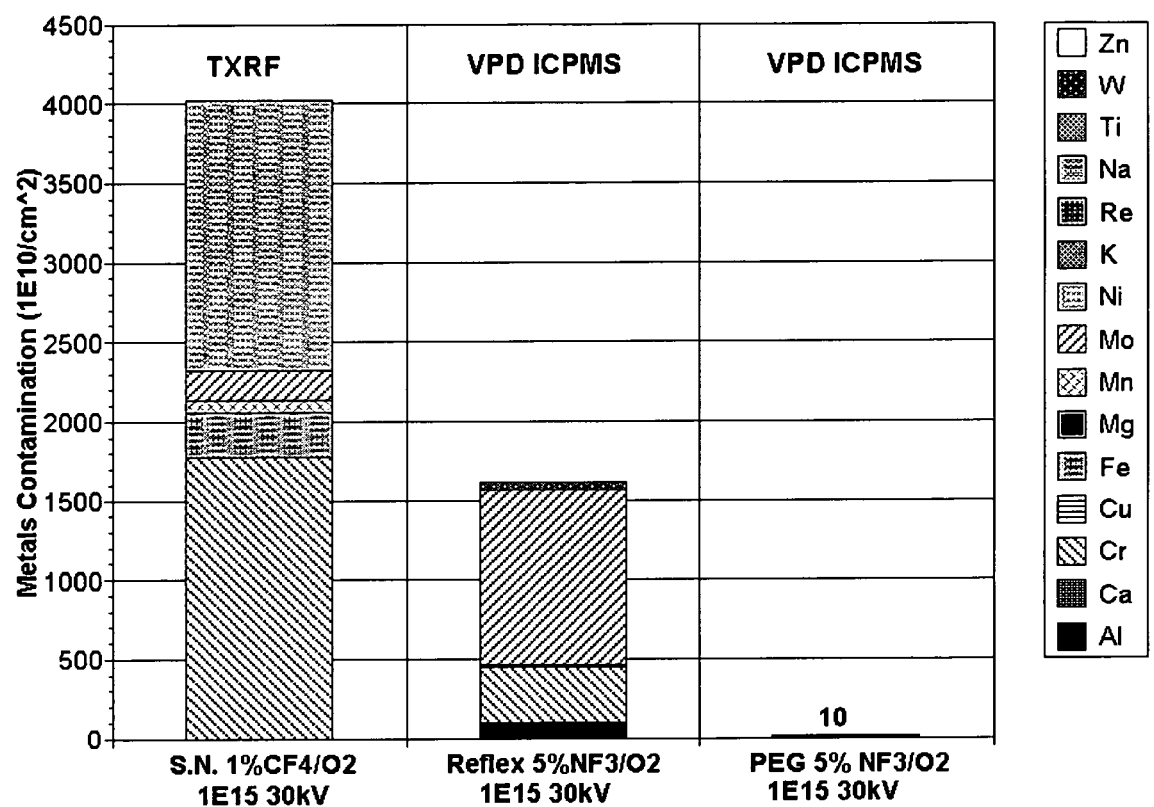
FIG. 14 is a graph showing improvement in reduction of metals contamination in semiconductor processing due to the improved ionizer of the invention.

FIG. 14 is a graph showing improvement in reduction of metals contamination in semiconductor processing due to the improved ionizer of the invention. The graph compares the performance of the prior art ionizer of FIG. 2 (left bar, labeled S.N.), the improved ionizer of the present invention of FIGS. 3 and 4 (middle bar, labeled Reflex) and the further improved ionizer 400 of the present invention (right bar, labeled PEG) in terms of metals contamination on a surface of a semiconductor wafer GCIB-processed with reactive etchant gas-cluster ions. All wafers received a GCIB processing dose of $1 \times 10^{15}$ gas-cluster ions/cm$^2$ with the indicated corrosive source gas mixture. The data for the self-neutralizing ionizer of FIG. 2 (shown in left bar) was obtained by TXRF measurement, while Vapor Phase Decomposition-Inductively Coupled Plasma Mass Spectrometry (VPD ICPMS) was used for measurement the improved ionizer of FIGS. 3 and 4 (middle bar) and for the improved ionizer 400 of the invention (right bar), utilizing the seven aperture electron extraction configuration of FIG. 8. The reduction in metallic contamination with the improved ionizer 400 of the invention is striking. With improved ionizer 400, metals performance with less corrosive gases mixtures is the same or better than that with $O_2$—$NF_3$. Although not readily apparent from FIG. 14, a considerable reduction in tungsten contamination occurs with the improved ionizer 400 of the present invention, indicating that the corrosive gases are not attacking the filament within the plasma chamber. Life tests were run using improved ionizer 400 with 5% $NF_3$ in oxygen for 400 hours and with 5% $GeH_4$ in argon for 350 hours. In both cases the source continued to run normally after test. In each case, after testing the ionizer was shut down to evaluate wear and no significant wear was evident on the filament or the plasma chamber.

Although FIGS. 5, 6, 7, 9, 10, 11, 12, and 13 have illustrated ionizers having a single plasma electron source (possibly having multiple apertures) for supplying ionizing electrons, it will be easily appreciated by those skilled in the art, that ionizers within the scope and spirit of the invention can be constructed having two or more plasma electron sources for providing electrons to the ionizing region in order to facilitate providing larger quantities of ionizing electrons to the ionizing region of the ionizer. Although the invention has been described with respect to various embodiments, it should be realized this invention is also capable of a wide variety of further and other embodiments within the spirit of the invention.

The invention claimed is:

1. An ionizer for forming a gas-cluster ion beam, comprising:
   an inlet end and an outlet end partially defining an ionization region through
      which a gas-cluster jet comprised of gas-clusters is directed along an axis, from the inlet end to the outlet end; and
   at least one plasma electron source for providing electrons to the ionizing region,
      the electrons for ionizing at least a portion of the gas-clusters to form a gas-cluster ion beam.

2. The ionizer of claim 1, further comprising a first set of substantially linear rod electrodes disposed substantially parallel to and in a partial, substantially cylindrical pattern about the gas-cluster jet axis, further defining the ionization region.

3. The ionizer of claim 2, wherein the first set of rod electrodes are anode electrodes disposed in a partial, substantially cylindrical pattern that is substantially concentric with the gas-cluster jet axis, the pattern having a radius $R_1$.

4. The ionizer of claim 3, further comprising a second set of substantially linear rod electrodes disposed substantially parallel to and in a partial, substantially concentric cylindrical pattern about the gas-cluster jet axis, the pattern having a radius $R_2$, wherein $R_2$ is greater than $R_1$.

5. The ionizer of claim 4, further comprising a third set of substantially linear rod electrodes disposed substantially parallel to in a partial, substantially concentric cylindrical pattern about the gas-cluster jet axis, the pattern having a radius $R_3$, wherein $R_3$ is greater than $R_2$.

6. The ionizer of claim 5, wherein:
   the second set of substantially linear rod electrodes are electrically biased to act as electron-repeller electrodes; and
   the third set of substantially linear rod electrodes are electrically biased to act as ion-repeller electrodes.

7. The ionizer of claim 3, wherein at least one electrode of the first set of rod electrodes, and the second set of rod electrodes comprises graphite.

8. The ionizer of claim 3, wherein:
   the ionization region is defined to be substantially cylindrical, having a clear aperture of radius $R_0$, wherein $R_0$ is less than $R_1$; and
   the ionization region has a length L, wherein L is greater than or equal to about $1.8 R_0$.

9. The ionizer of claim 1, wherein:
   the ionization region is defined to be substantially cylindrical, having a clear aperture of radius $R_0$; and
   the inlet end comprises an extension tube for reducing the extraction of positive ions through the inlet end.

10. The ionizer of claim 9, wherein the extension tube is of a length greater than or equal to about $2 R_0$.

11. The ionizer of claim 1, wherein the at least one plasma electron source comprises a plasma chamber body defining a plasma chamber and including one or more apertures through which electrons are provided to the ionization region for at least partially ionizing the gas-cluster jet by electron-impact ionization.

12. The ionizer of claim 11, wherein the plasma chamber contains a plasma of a noble gas.

13. The ionizer of claim 11, wherein the at least one plasma electron source further comprises:
   a heated thermionic filament within the plasma chamber for emitting electrons;
   an aperture for introducing a noble gas into the plasma chamber;
   means for accelerating the electrons to generate a plasma of said noble gas within the plasma chamber;
   an acceleration-deceleration electrode; and
   a biasing means for extracting electrons from the plasma in the plasma chamber into the ionization region.

14. The ionizer of claim 13, wherein:
   the thermionic filament is a metal filament that evaporates undesired metal vapor; and
   the one or more apertures in the plasma chamber body are arranged to reduce the transmission of evaporated metal into the ionization region.

15. The ionizer of claim 13, wherein the thermionic filament is a metal filament that evaporates undesired metal vapor and is disposed within the plasma chamber such that no direct line-of-sight path from the thermionic filament into the ionization region exists.

16. A gas-cluster ion beam processing apparatus for processing a workpiece by gas-cluster ion beam irradiation, comprising:
   a reduced-pressure atmosphere enclosure;
   a nozzle within the enclosure for forming a gas-cluster jet comprising a plurality of gas-clusters;
   an ionizer within the enclosure for ionizing at least a portion of the gas-clusters in the gas-cluster jet to form a gas-cluster ion beam, the ionizer comprising:
      an inlet end and an outlet end defining an ionization region through which a gas-cluster jet comprised of gas-clusters is directed along an axis, from the inlet end to the outlet end; and
      at least one plasma electron source for providing electrons to the ionizing region, the electrons for ionizing at least a portion of the gas-clusters to form a gas-cluster ion beam;
   acceleration means within the enclosure for accelerating said gas-cluster ion beam; and
   means for positioning a workpiece within the enclosure for irradiation by the accelerated gas-cluster ion beam.

17. A method for forming a gas-cluster ion beam comprising the steps of:
   providing a reduced pressure atmosphere enclosure;
   generating a gas-cluster jet comprised of a plurality of gas-clusters within the reduced-pressure atmosphere;
   providing an ionization region within the reduced pressure atmosphere;
   directing the gas-cluster jet through the ionization region;
   providing at least one plasma electron source near the ionization region;
   directing electrons from the at least one plasma electron source into the ionization region to ionize at least a portion of the gas-clusters in the gas-cluster jet to form a gas-cluster ion beam.

18. An ionizer for electron-impact ionization of a gas-cluster jet traveling along a gas-cluster jet axis, comprising:
   a first set of substantially linear rod electrodes disposed substantially parallel to and in a substantially cylindrical pattern that is substantially concentric about the gas-cluster jet axis and that has a first radius $R_1$;

a second set of substantially linear rod electrodes disposed substantially parallel to and in a substantially concentric cylindrical pattern about the gas-cluster jet axis, the substantially concentric cylindrical pattern having a radius $R_2$, wherein $R_2$ is greater than $R_1$;

one or more substantially linear thermionic filaments disposed substantially parallel to the gas-cluster jet axis at a distance greater than the first radius and less than the second radius;

heating means for heating the one or more thermionic filaments to produce a thermionic electron emission;

electrical biasing means to bias the first set of substantially linear rod electrodes with respect to the one or more thermionic filaments to perform as anode electrodes;

electrical biasing means to bias the second set of substantially linear rod electrodes with respect to the one or more thermionic filaments to perform as electron-repeller electrodes;

support means for mechanically supporting the first set of rod electrodes, the second set of rod electrodes, and the one or more thermionic filaments relative to the gas-cluster jet so that the gas cluster jet passes through the ionizer for at least partial ionization of the gas-cluster jet to form a gas-cluster ion beam.

19. The ionizer of claim 18, wherein:

at least one electrode of the first set of rod electrodes, and the second set of rod electrodes is comprised of graphite; and the gas-cluster jet is comprised of reactive gas clusters.

* * * * *